(12) United States Patent
Brandsma et al.

(10) Patent No.: US 8,670,077 B2
(45) Date of Patent: Mar. 11, 2014

(54) FAST SERVICE SCAN

(75) Inventors: Ewout Brandsma, Eindhoven (NL);
Klaas de Waal, Waalre (NL);
Konstantinos Doris, Amsterdam (NL);
Erwin Janssen, Veldhoven (NL)

(73) Assignee: NXP B.V., Eindhoven (NL)

( * ) Notice: Subject to any disclaimer, the term of this patent is extended or adjusted under 35 U.S.C. 154(b) by 277 days.

(21) Appl. No.: 12/881,627

(22) Filed: Sep. 14, 2010

(65) Prior Publication Data

US 2011/0109811 A1     May 12, 2011

(30) Foreign Application Priority Data

Sep. 14, 2009    (EP) .................................... 09252181

(51) Int. Cl.
| | |
|---|---|
| *H04N 5/455* | (2006.01) |
| *H04N 5/44* | (2011.01) |
| *H04N 5/14* | (2006.01) |
| *H04N 5/50* | (2006.01) |
| *H04L 1/20* | (2006.01) |
| *H04L 27/10* | (2006.01) |
| *H04J 14/02* | (2006.01) |

(52) U.S. Cl.
CPC ............. *H04N 5/455* (2013.01); *H04N 5/4401* (2013.01); *H04N 5/14* (2013.01); *H04N 5/50* (2013.01); *H04L 1/205* (2013.01); *H04L 27/10* (2013.01); *H04J 14/0221* (2013.01)
USPC ........ 348/732; 348/572; 348/726; 324/76.19; 324/76.27; 375/226; 375/272; 398/94; 455/77; 455/150.1

(58) Field of Classification Search
USPC .................................. 348/732; 455/77, 150.1
See application file for complete search history.

(56) References Cited

U.S. PATENT DOCUMENTS

| | | | |
|---|---|---|---|
| 6,509,934 B1 * | 1/2003 | Bao et al. ...................... | 348/570 |
| 6,538,704 B1 * | 3/2003 | Grabb et al. ................... | 348/731 |
| 2005/0140354 A1 | 6/2005 | Meir | |
| 2005/0179818 A1 | 8/2005 | Wong et al. | |
| 2006/0170829 A1 * | 8/2006 | Mori ............................. | 348/732 |
| 2007/0067816 A1 * | 3/2007 | Van Horck et al. ........... | 725/100 |
| 2007/0146555 A1 | 6/2007 | Wada | |
| 2008/0225168 A1 * | 9/2008 | Ouslis et al. .................. | 348/554 |
| 2008/0225170 A1 * | 9/2008 | Silver et al. ................... | 348/555 |
| 2008/0225174 A1 * | 9/2008 | Greggain et al. ............. | 348/572 |
| 2008/0225175 A1 * | 9/2008 | Shyshkin et al. ............. | 348/572 |

(Continued)

FOREIGN PATENT DOCUMENTS

| | | |
|---|---|---|
| GB | 2 325 363 A | 11/1998 |
| JP | 2003-234975 A | 8/2003 |

OTHER PUBLICATIONS

Extended European Search Report for European Patent Appln. No. 09252181.4 (Mar. 24, 2010).

*Primary Examiner* — Nasser Goodarzi
*Assistant Examiner* — Michael B Pierorazio

(57) ABSTRACT

A method of performing a service scan for available channels across a bandwidth of an input signal, the method comprising the steps of: acquiring a power spectrum of the input signal bandwidth; analyzing the power spectrum to identify a list of candidate channels, each candidate channel being identified by at least a center frequency; processing each of the candidate channels in a receiver unit to extract service information, if present, relating to the candidate channel; and storing the service information for the channel in a memory.

15 Claims, 4 Drawing Sheets

(56) References Cited

U.S. PATENT DOCUMENTS

| | | | |
|---|---|---|---|
| 2008/0225176 A1* | 9/2008 | Selby et al. | 348/572 |
| 2008/0225182 A1* | 9/2008 | Silver et al. | 348/726 |
| 2008/0242237 A1* | 10/2008 | Rofougaran et al. | 455/77 |
| 2009/0102981 A1* | 4/2009 | Mody | 348/732 |
| 2009/0290552 A1* | 11/2009 | Bertorelle | 370/329 |
| 2010/0120386 A1 | 5/2010 | Konstantinos et al. | |
| 2010/0304700 A1* | 12/2010 | Kamata et al. | 455/234.1 |
| 2010/0322119 A1* | 12/2010 | Li et al. | 370/280 |
| 2011/0269491 A1* | 11/2011 | Eberhart et al. | 455/509 |
| 2012/0034937 A1* | 2/2012 | Cahill et al. | 455/465 |

* cited by examiner

FAST SERVICE SCAN

This application claims the priority under 35 U.S.C. §119 of European patent application no. 09252181.4, filed on Sep. 14, 2009, the contents of which are incorporated by reference herein.

FIELD OF THE INVENTION

The invention relates to faster service scanning of available channels in multi-channel receivers such as digital television receivers.

BACKGROUND OF THE INVENTION

Future television receivers are likely to be based on wideband multi-channel receiver technology, known as Full Spectrum Reception (FSR) technology.

In the FSR approach, wide-band digitization is used to capture the complete composite input signal. In the case of cable television signals, the complete TV band between DC and approximately 1 GHz is captured with a high speed Analog-to-Digital Converter (ADC). This approach has many benefits over the traditional analog tuner based approach. For example, a large number of tuners can be realized at minimal hardware cost. The FSR approach also enables new features which cannot be economically realized with the traditional analog approach, such as fast channel changing and faster service scanning of available channels. In order to realize a faster service scan, spectral analysis of the input signal is required.

During initial installation of a conventional receiver, a table is generated with centre frequencies of all available channels. If this information is not broadcast by the network operator, for example by means of a dedicated channel known to the receiver beforehand, the receiver needs to scan the whole spectrum in order to locate channels. Traditional scanning is slow because every frequency has to be tested to determine whether a channel is present. If, however, an accurate measure of the entire spectrum can be more quickly made, the location of each channel could be determined from this, removing the need for a full scan.

Digital television broadcasting—compliant with, for example, DVB, ATSC, or ARIB standards—involves transmitting an MPEG2 Transport Stream at a certain channel (frequency) within a particular medium (terrestrial, satellite, or cable). A particular modulation scheme (e.g. PSK, QAM, OFDM, VSB) is used to modulate the Transport Stream data within the channel of the particular medium. Typically, a plurality of services, for example in the form of television programmes with associated information (e.g. alternate audio streams, subtitles and interactive data content), will be carried by a single transport stream on a single channel.

Digital television receivers will normally be equipped with service presets. By keying in a specific number on a remote control the user can start watching a particular service (e.g. NBC, BBC1, Nederland 1 etc.). When the digital television receiver is first deployed in a new environment, for example when a user buys a new television and installs it at home, it is necessary to perform a service scan in order to obtain information about all the channels that may be available. In a service scan, the entire television band is scanned for the presence of television (and other) services, and information relating to the available services is stored in the memory of the receiver. Each of the individual services will be associated with a certain preset (i.e. a given number). The service scan may also need to be repeated at some later time, for example if the channel allocation of services is changed or new services are added.

Conventional digital television receivers are equipped with one, or possibly more than one, tuner. Such a tuner is capable of tuning to a channel at a certain frequency and subsequently providing the baseband signal in that channel to a demodulator (e.g. DVB-S, DVB-C, or DVB-T). The demodulator will subsequently provide an MPEG2 Transport Stream to the Transport Stream de-multiplexer. The Transport Stream de-multiplexer is able to extract coded audio and video data, but also meta-data about the services present in the Transport Stream (e.g. service-id and service-name as encapsulated in tables such as PAT and PMT).

In the known art a service scan is performed as follows:

```
for (f=startfreq; f < endfreq; f += stepsize)
{
Tune tuner to frequency (f);
if (signal_present) /* tuner locks */
{
Try to demodulate baseband signal;
if (transport_stream_present) /* not all signals may be DTV broadcast */
{
  Demultiplex transport_stream and extract meta_data;
  Store channel preset based on meta_data;
}
}
}
```

In digital television applications, for example with MPEG2 transport stream, a single channel may contain multiple TV services, leading to multiple presets. More than one channel preset may in such cases be stored for a single detected signal.

Following the above algorithm, the tuner sequentially scans the entire band, scanning over all frequencies (from startfreq to endfreq) at a given resolution (defined by stepsize). If the tuner locks (signal_present), and the baseband signal contains a properly modulated Transport Stream (transport_stream_present), the meta data is extracted and stored in the memory of the receiver.

The above process can be very time consuming, typically taking tens of minutes or even hours, particularly if the resolution (stepsize) has to be chosen to be small to ensure that all available channels are identified. If the channels are mapped to a fixed frequency grid that is known in advance, the process can proceed more quickly, because the value for stepsize can be chosen to match the present grid pattern. This is typically the case for terrestrial digital television transmissions, but not for satellite transmissions.

Many methods are known to exist for speeding up a service scan. All of these known methods are, however, based on having a priori information available about the service and channel allocations in the band over which a service scan is to be performed.

It is known that a service on the internet can provide all available channel and service allocations for a certain medium. The user only has to enter his locality (e.g. ZIP-code) and optionally a service provider from a short list. The internet service can then provide all the necessary data, which can be stored immediately into the receiver memory without the need for a conventional service scan. An example of such a system is in Windows Media Center in Microsoft Windows Vista. A similar kind of system is disclosed in international published patent application WO 2005/015738. Internet connectivity is not, however, always necessarily available and may not be present when installing a receiving unit, particularly a stand-alone digital television receiver.

Another known solution for a faster service scan involves a service provider providing a full database of channel and service allocations as an integral part of the broadcast service. At least one channel will have a so-called Network Information Table (NIT) included in the Transport Stream. This NIT contains all necessary information, which can be stored directly into the receiver memory. The receiver only requires to be supplied with the frequency of the channel containing the NIT in order to receive all available channel information. In a vertical service offering (i.e. where one provider maintains control of all channel information as well as the receiver factory configuration), the receiver (STB) may come pre-configured with this one particular frequency. This solution would work well if a single provider owns the medium. This is typically the case for cable providers, but if multiple providers or broadcasters share a single medium (e.g. terrestrial broadcast or satellite transponders) this is less likely to be the case.

In summary, currently known fast scanning solutions tend to be based on having a priori information about available channels being present. This information may be provided either out-of-band (e.g. via the internet) or in-band (e.g. via a NIT on a dedicated channel). When such information is not available (for example in the cases of there being no internet connection or more than one service provider), these solutions do not work and a lengthy 'brute force' service scan is necessary. This is a particular problem a fixed frequency grid is not defined, which is the case for satellite television.

Although a lengthy service scan operation may be a one-off operation, further service scans may need to be carried out when the channel list is updated. It would therefore be advantageous to speed up the process of performing a full scan for available channels.

OBJECT OF THE INVENTION

It is an object of the invention to address one or more of the above-mentioned problems, and in particular to provide a method for a fast service scan without the need for any a priori knowledge of channel information.

SUMMARY OF THE INVENTION

In accordance with a first aspect of the invention there is provided a method of performing a service scan for available channels across a bandwidth of an input signal, the method comprising the steps of:

acquiring a power spectrum of the input signal bandwidth;

analysing the power spectrum to identify a list of candidate channels, each candidate channel being identified by at least a centre frequency;

processing each of the candidate channels in a receiver unit to extract service information, if present, relating to the candidate channel; and storing the service information for the channel in memory.

The step of acquiring the power spectrum may comprise digitising the input signal, wherein the steps of identifying and analyzing the power spectrum are performed on the digitized input signal.

One or more of the candidate channels may further be identified by a measure of the power spectrum around a centre frequency of the candidate channel. The spectral shape may include a measure of the bandwidth of the candidate channel.

In identifying the list of candidate channels, candidate channels may be excluded, without being processed, as a result of a measured spectral shape.

The method is preferably carried out in a multi-channel receiver configured to receive digital television signals over a transmission medium. The transmission medium may for example be a terrestrial or satellite broadcast, or cable.

In accordance with a second aspect of the invention there is provided a multi-channel receiver system comprising:

a spectrum identifier module configured to derive a power spectrum from an input wideband signal;

a spectrum analysis module configured to analyse the spectrum and identify candidate channels by their centre frequency;

a controller module configured to instruct the spectrum identifier and analysis modules to process a list of the candidate channels derived from the power spectrum and to store service information relating to candidate channels in a memory; and a receiver module configured, in response to instructions received from the controller module, to tune to each candidate channel centre frequency and output to the controller module any service information present at each candidate channel centre frequency.

The receiver module preferably comprises a plurality of receiver modules, wherein the controller is configured to instruct the receiver modules to operate in parallel to determine service information relating to the candidate channels.

The multi-channel receiver preferably comprises a full spectrum analog to digital converter (ADC) configured to supply a digitized version of the input signal to the spectrum identifier module and to each receiver module.

Each receiver module preferably comprises a tuner, a demodulator and a stream analyzer. The tuner may be in the form of a channel filter, in the case where the input signal is digitized by the ADC.

In certain embodiments the demodulator and stream analyzer may be disposed in one or more receiver modules disposed in one or more respective client units remote from a central control unit comprising the tuners, controller, memory, spectrum identifier and spectrum analyzer. The controller may be configured to provide instructions to each of the one or more client units to demodulate and analyze candidate channel signals from respective tuners and to return service information relating to the candidate channels.

An advantage of the invention is that a service scan can be performed considerably faster than existing methods, because candidate channels can be identified from a rapidly acquired power spectrum of the input signal, rather than by a slow scan of all available frequencies. The use of a power spectrum thereby narrows down a search for available channels by identifying frequencies within the input signal bandwidth where a channel may be present.

BRIEF DESCRIPTION OF THE DRAWINGS

Exemplary embodiments of the invention are described by below with reference to the appended drawings, in which.

DETAILED DESCRIPTION OF THE EMBODIMENTS

Figure 1:
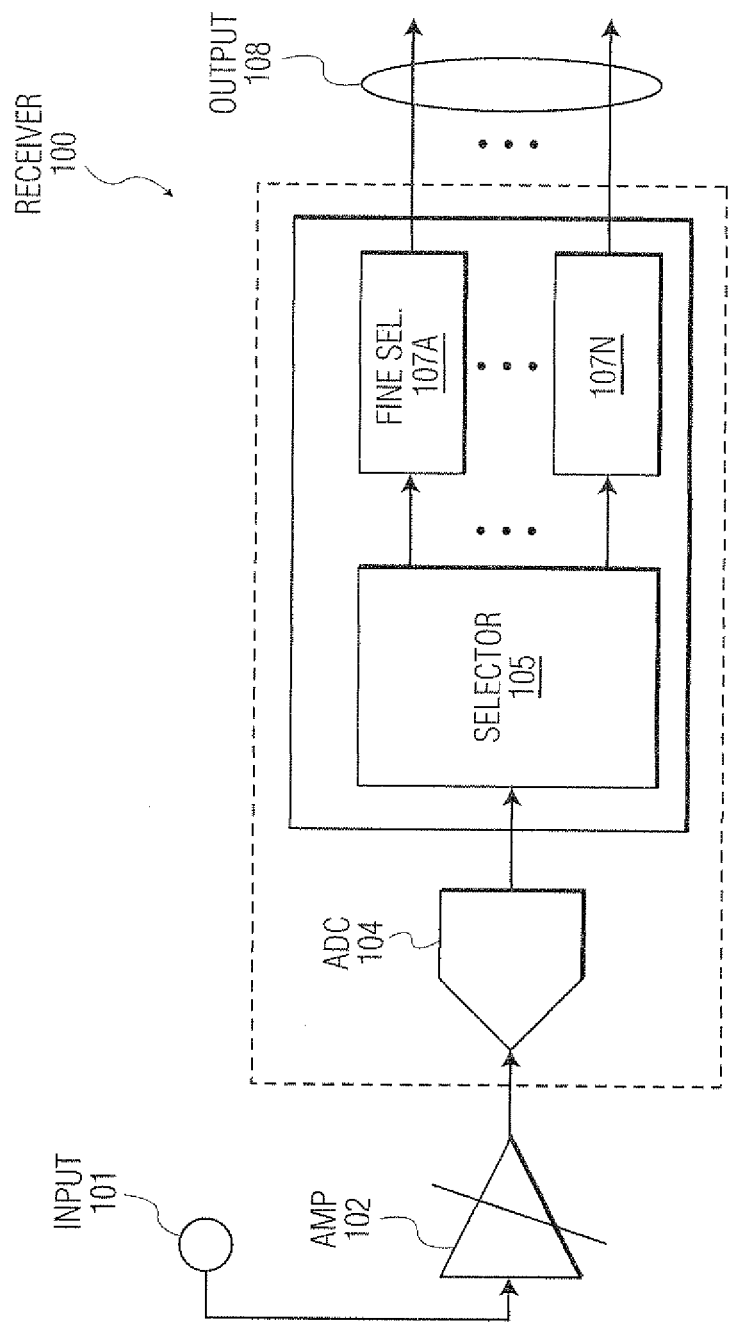
FIG. 1 is a schematic diagram of an exemplary wideband multi-channel receiver architecture.

An exemplary architecture of a wideband multi-channel receiver 100 is depicted schematically in FIG. 1. An RF input signal received at an RF input 101 is first amplified in an LNA/VGA block 102. The amplified signal from the LNA block 102 is digitized using an analog to digital converter ADC 104. The output of the ADC 104 is then passed to a multi-band selector 105 in a multi-channel selector module 106, which splits the input signal into a number of bands. The bands are passed to one of more channel selector blocks 107A-107N, which perform fine selection. Multiple digital output streams 108 are output from the receiver 100.

As a first step in installing broadcast services in a receiver, in accordance with an embodiment of the invention the Power Spectral Density (PSD) shape of the entire broadcast band is identified. The power spectrum may be derived by digitizing the entire bandwidth of the input signal and processing the digitized signal. The digitized signal may be processed by calculating the power spectral density (PSD) from a fast Fourier transform (FFT) of the signal.

Secondly, the PSD shape is analyzed to create a list of probable, or candidate, channels in use by broadcast services. These probable channels are each identified by a centre frequency and possibly also by bandwidth and type of channel.

The candidate channels are then processed, which may be carried out in turn on a single receiver or in parallel on a plurality of receiving units. Each receiving unit will typically comprise a tuner, a channel demodulator and a stream analyzer (e.g. in the form of a transport stream de-multiplexer). When processing candidate channels in parallel, subsets of candidate channels on the list are divided among a plurality of receiving units, to further increase the speed of the service scan. Each receiving unit tunes to a channel allocated to it, and extracts any relevant service information that may be present (e.g. the channel frequency, service identifier and service name). The service information for each channel, once identified, is then installed into the memory of the receiver.

Figure 2:
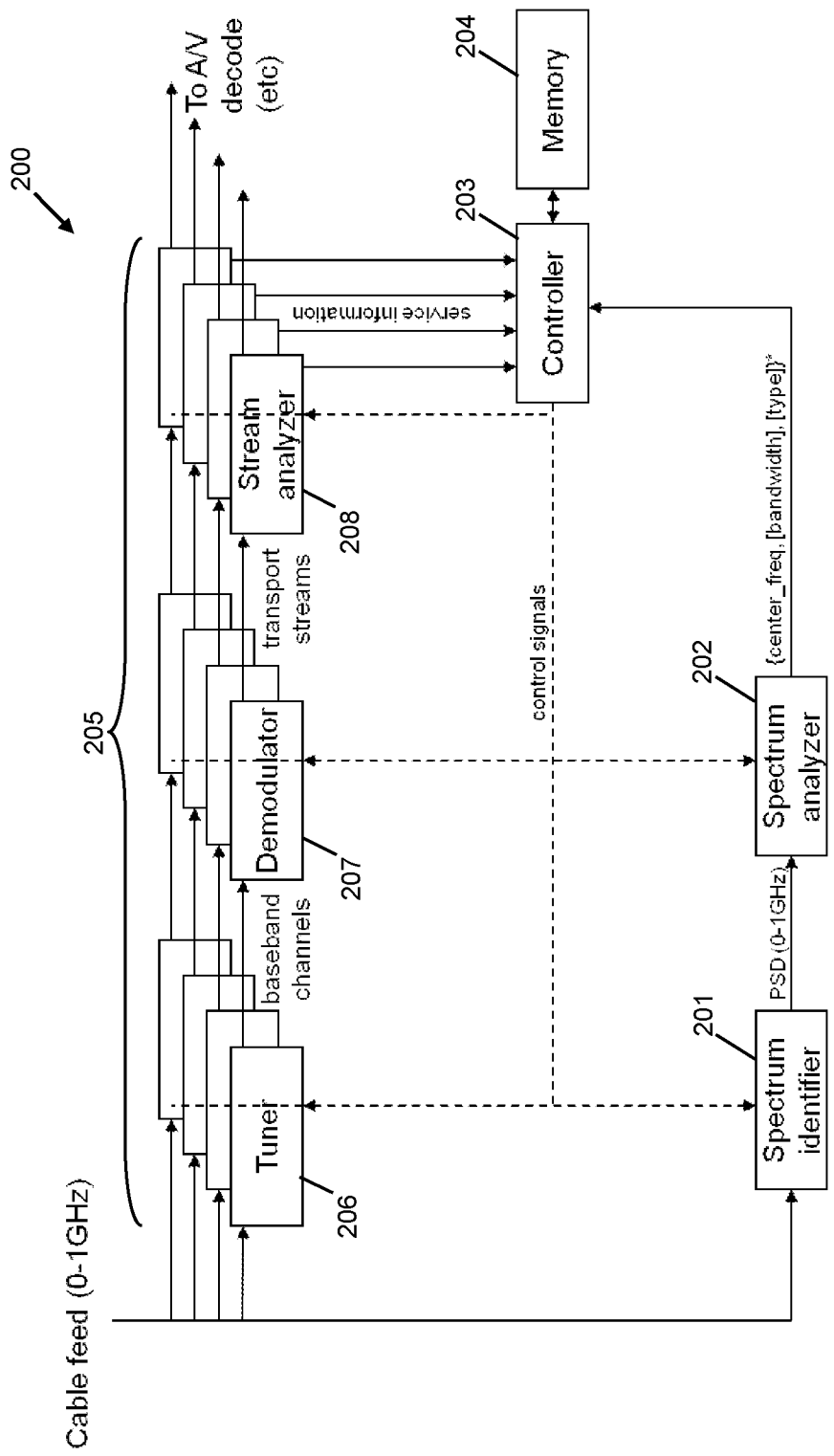
FIG. 2 is a schematic system diagram of a multi-channel cable television broadcast receiver.

Shown in FIG. 2 is a schematic system diagram of a cable television broadcast receiver system 200 configured according to an embodiment of the invention. Similar configurations may be applicable for use in other types of receivers, such as terrestrial- or satellite-based television or radio broadcast receivers.

The spectrum identifier 201 identifies the PSD shape of the entire broadcast band. This PSD shape should have sufficient resolution for further analysis, i.e. to allow a receiver to tune and lock on to a channel given a centre frequency value derived from the power spectrum.

The spectrum analyzer 202 is used to discriminate individual channels (typically 5-8 MHz wide) that may contain usable broadcast signals. For each candidate channel, at least the centre frequency is computed. This centre frequency must be identified with sufficient accuracy, typically of the order of 10s of kHz, for a tuner to be able to lock on the signal. The bandwidth of the individual channels and their spectral shape may also be of interest, because this information could be used to infer information about the probable type of modulation and signal used, as described further below.

The output of the spectrum analyzer 202 is a list of candidate television channels identified by their respective centre frequencies and, optionally, also by information about bandwidth and type of signal as part of the list. A controller 203 accepts the list and stores the list in memory 204 for further processing. At least part of the above analysis may, in certain embodiments, be carried out by the controller 203 itself.

The list of candidate channels is further processed by the controller 203 using one or more receiving units 205, each receiver unit comprising a tuner 206, a demodulator 207 and a stream analyzer 208. The stream analyzer 208 may be in the form of a transport stream de-multiplexer.

Processing each item on the list of candidate channels involves the following sub-steps. The controller 203 instructs the tuner 206 to tune to a centre frequency of a candidate channel. The tuner 206 locks on that frequency, if a signal is present, and then passes the signal received on that frequency to the demodulator 207. The demodulator 207 then demodulates the signal into a data stream, such as an MPEG2 transport stream. The stream analyzer 208 then extracts relevant information about the service(s) present in the channel. The controller 203 then receives the service information from the stream analyzer 208 and stores this information in memory as part of a service list. The service list is the final result of the service scan, once all candidate channels in the candidate channel list have been analyzed.

It is possible that a centre frequency identified in the candidate channel list either does not contain a suitable television channel or that reception conditions are such that the signal is not usable. The result of this will be that the sub-steps carried out by the tuner 206 onwards will fail. In such a case the controller 203 will conclude that no services are present at this frequency and no entry for that frequency will be added to the service list. The controller 203 then moves on to the next candidate channel in the list and instructs the receiver to tune to the associated frequency, starting the above series of sub-steps again.

Having a plurality of receiving units 205, as shown in FIG. 2, enables processing of the candidate channel list in parallel. Each item (centre frequency, etc) is processed by one of the receiving units 206, but multiple receiving units may be working on different items of the list at the same time. The controller 203 is configured to take items from the list one by one and schedule them for processing by a receiving unit, as well as collect the service information results of the receiving units 205 as they are output by the stream analyzers 208.

The above described method will work with only a single receiving unit, although the method will be considerably faster when multiple receiver units are available. However, even with only a single receiving unit, the process of identifying and analyzing the spectrum by the spectrum identifier 201 and analyzer 202 will result in a faster service scan in comparison to a conventional system in which a full scan of the entire spectrum is performed.

Figure 3:
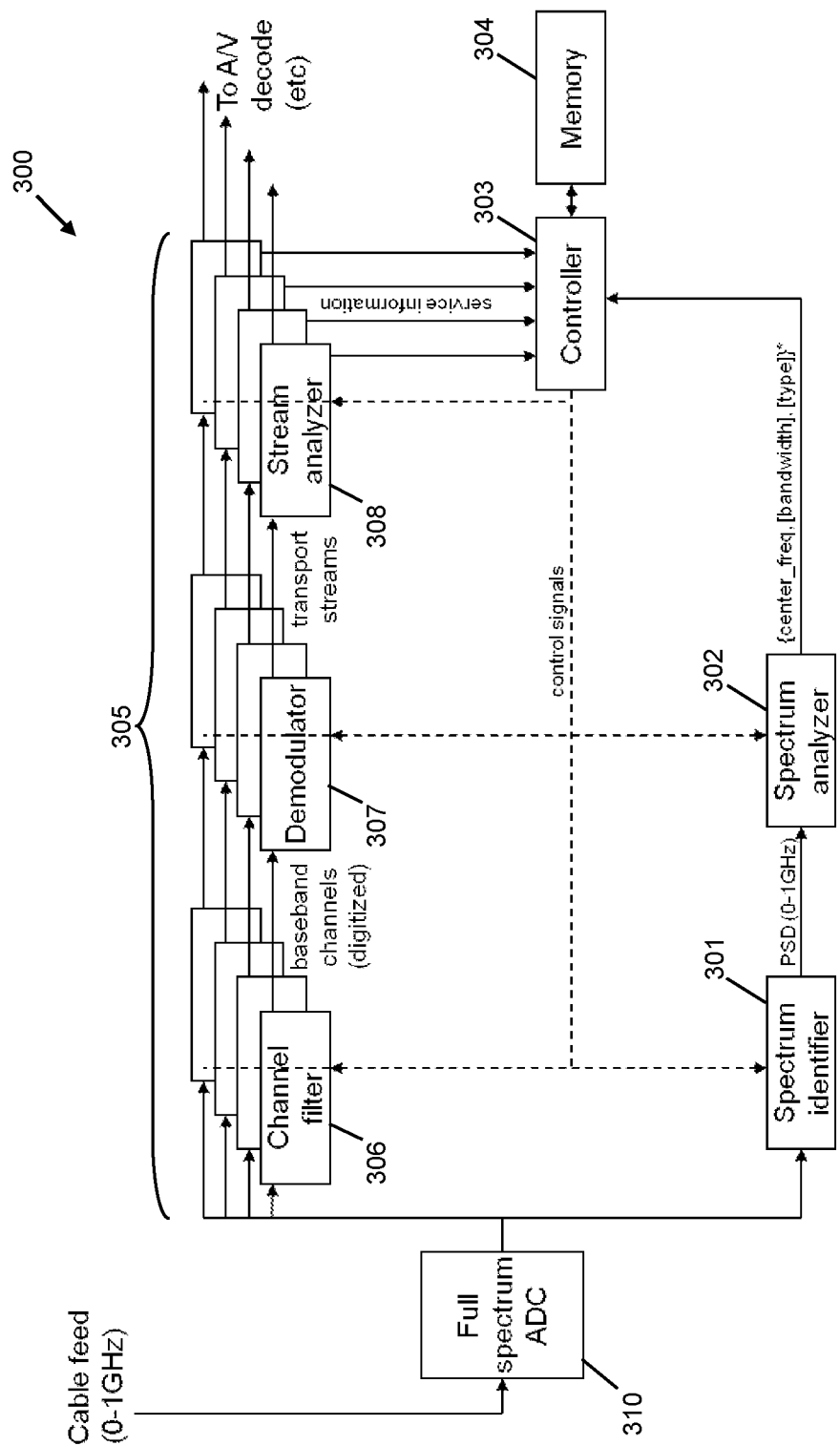
FIG. 3 is a schematic system diagram of an alternative multi-channel cable television broadcast receiver.
Figure 4:
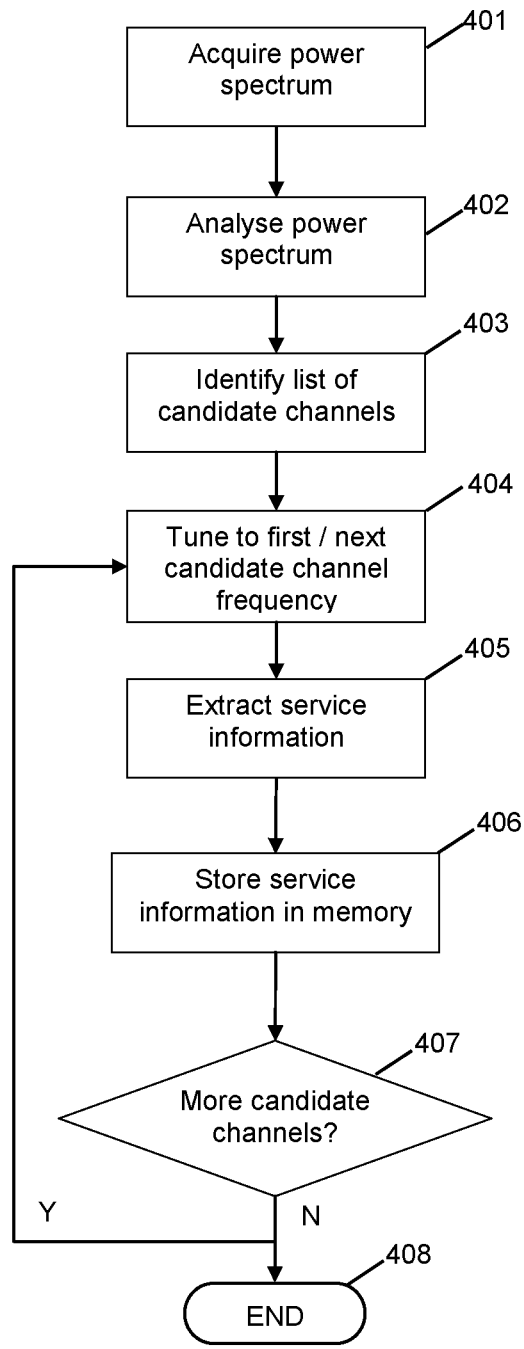
FIG. 4 is a flow chart illustrating an embodiment of a method according to the invention.

Shown in FIG. 3 is a schematic system diagram of an alternative embodiment of a cable television broadcast receiver 300 in which the cable feed is digitized by a full spectrum ADC 310 and a digital signal provided to the spectrum identifier 301 and to a tuner in the form of an adjustable channel filter 306 in each of the one or more receiving units 305. The full spectrum of the input TV bandwidth signal is first digitized, and all subsequent processing takes place in the digital domain. Each channel filter 306 implements channel selection in the digital domain, which performs an equivalent operation to that provided by the tuners 206 in FIG. 2. The spectrum identifier 301 also operates fully in the digital domain on the output of the full spectrum ADC 310.

It can be seen that the embodiments illustrated in FIGS. 2 and 3 differ only in the way the tuner or channel filter and spectrum identifier functions are implemented. The steps of identifying and analyzing the spectrum, and of processing the candidate channel list to arrive at the service list, are otherwise functionally the same, although these are now performed in the digital domain.

Because the steps of spectrum identification and tuning, demodulation and service information extraction take place sequentially in time, one or more of the channel filters 306 and the spectrum identifier 301 may be mapped on to the same hardware resources. Spectrum identification may for example be carried out using intermediate baseband channel signals output from each channel filter.

As mentioned above, when analyzing the PSD shape the bandwidth of the individual channels and/or their spectral shape may be of interest in addition to the centre frequency of candidate channels. This additional information could be used to infer information about the probable type of modulation and signal used. For example, the bandwidth of a channel may be used to distinguish between television broadcasts and radio broadcasts, the former requiring a larger bandwidth. Other characteristics of individual channels may also be inferred, for example to distinguish between analog and digital TV transmissions by analyzing the spectral shape of the candidate channels. An analog channel can, for example, be recognized by the presence of two carrier signals close to each other, characterised by narrow spikes in the spectrum, with all energy concentrated around a single frequency. A digital channel, on the other hand, will tend to be wider and have a smooth shape, as energy is more evenly spread over the complete bandwidth of the channel.

The additional information available from spectral analysis may therefore be used to further reduce the list of candidate channels to be inspected. For example, in a digital TV receiver only digital TV channels need to be inspected and added to the service list. Analog TV channels and radio channels do not necessarily need to be taken into account, and can therefore be ignored by not adding them to the candidate channel list. This results in a reduced list that will further reduce the time taken to process the list and derive a service list.

In another embodiment, the additional information may be used to pre-select the appropriate type of demodulator and stream analyzer for use in decoding the candidate channel. This is advantageous in, for example, the case of a hybrid TV receiver that is able to decode both analog and digital TV channels. Instead of attempting to decode a candidate channel using digital demodulation and stream analysis on an analog TV channel and vice versa, the appropriate processing can be flagged in the candidate channel list. This can also lead to additional gains in the speed of the service scan.

As mentioned above, with conventional technology a service scan may be a particularly lengthy process for a satellite receiver, where a number of broadcast spectra need to be scanned. A full scan for a satellite receiver can last up to several hours. Each transponder, residing at a specific geostationary orbital position, may utilize both horizontal and vertical polarization, resulting in two independent signals being supported. In addition, multiple transponders at different orbital positions may be supported by the satellite receiver. Signals from multiple transponders may be also receivable simultaneously if multiple dishes, or a multi-LNB dish, are deployed. A typical example is a five-LNB dish, which is capable of reception from 10 spectra (5 orbital positions×2 polarizations) simultaneously.

Such satellite receiver systems can be deployed to enable reception of many different satellites by many different clients in a single home or a building (i.e. multi-room scenarios). Different system solutions exist or can be imagined. These relate in particular to different ways of partitioning the respective receiving units (tuner, channel demodulator, stream analyzer) between a central unit and the clients. The central unit could be part of the satellite dish apparatus itself, a separate box, or even a combination of both.

In one exemplary system based on the embodiment shown in FIG. 2, all the tuners 206 are disposed in a central unit, and the demodulators 207 and stream analyzers 208 are disposed in separate client units. The clients are typically connected to the central unit by means of a single coaxial cable. A channel selected at one particular client is re-modulated at a specific frequency. This solution of only forwarding channels that are requested by clients (instead of all spectra) enables use of a single coaxial cable between the central unit and each client unit, and allows each client unit to be of lower complexity and cost.

In an alternative system solution, all the receiving units 205 (tuners 206, channel demodulators 207 and stream analyzers 208) are concentrated in a central unit (e.g. a multi-room DVR server or a so-called "networked dish"). Individual TV services (Single Program Transport Streams) are streamed from this central unit to the respective clients over, for example, an IP-based network (e.g. utilizing DLNA/UPnP protocols). This enables use of e.g. Ethernet or WiFi for connecting the clients to the central unit. This setup may also enable multi-room DVR (digital video recording).

For any of the systems described herein, it is advantageous to use a plurality of multi-channel receiver units. In a multi-user system, one multi-channel receiver needs to be used for each of the many (e.g. ten) spectra that must be simultaneously receivable by the central unit. It is possible to receive a plurality of channels from a single spectrum with a single multi-channel receiver.

A further embodiment of the current invention may involve a fast service scan of multiple spectra available to the system, involving computing (preferably in parallel) the PSD shapes of the plurality of spectra, analyzing the PSD shapes for probable TV channels and creating a list of candidate channels. The list is then processed using the plurality of receiving units and the complete service list generated and stored.

In the alternative distributed system above, the receiving units 205, 305 are physically distributed between a central unit on one hand and the respective clients on the other hand. This means a distributed implementation of the above algorithm would be required, involving a bidirectional communication channel for control messages to be sent between the central unit and each clients. For processing the list of candidate channels the communication network is used to send subsequent requests from the central unit to each of the clients requesting the inspection of one particular channel that is forwarded to it over the coaxial cable. Each client will respond to each request by sending back the service information found to the central unit. In the fourth step the central unit will broadcast the complete service list (the end-result of the scan) to all the clients.

The invention may be broadly applicable to many kinds of RF receivers where available services are required to be identified beforehand, and is in particular applicable to digital television receivers, which may for example be based on DVB, ATSC, or ARIB standards. The invention may also be applicable to digital radio receivers and to analog television or radio receivers.

The controller module 203, 303 may be software programmable, allowing the invention to be implemented by means of software instructions loaded on to the receiver unit 200, 300, for example via the memory 204, 304. Operation of the receiver unit 200, 300 may therefore advantageously be updated remotely by transmission of updated software over the transmission medium.

Other embodiments are intentionally within the scope of the invention as defined by the appended claims.

The invention claimed is:

1. A method of performing a service scan for available channels across a bandwidth of an input signal, the method comprising:
   acquiring a power spectrum of the input signal across the bandwidth;
   analyzing the acquired power spectrum to compute center frequencies and identify a list of candidate channels, each candidate channel in the list of candidate channels being identified by a respective center frequency;
   processing, in parallel, each of the candidate channels in a separate receiver unit to extract any service information relating to the candidate channel, wherein each item in the list of candidate channels is processed by one receiver unit; and
   storing the extracted service information for the candidate channel in a memory.

2. The method of claim 1, further comprising:
   digitizing the input signal, wherein both the analyzing and the processing are performed on the digitized input signal.

3. The method of claim 1, further comprising:
   measuring a shape of the acquired power spectrum around the center frequency of the candidate channel to identify the candidate channel.

4. The method of claim 3, wherein the shape includes a measure of the bandwidth of the candidate channel.

5. The method of claim 1, further comprising:
   excluding at least one candidate channel without being processed as a result of a measured spectral shape.

6. The method of claim 1, wherein the method is carried out in a multi-channel receiver configured to receive digital television signals over a transmission medium.

7. The method of claim 6, wherein the transmission medium is one of a terrestrial broadcast medium, a satellite broadcast medium, and a cable transmission medium.

8. A multi-channel receiver system comprising:
   a spectrum identifier module configured to derive a power spectrum from an input wideband signal;
   a spectrum analysis module configured to analyze the derived power spectrum, compute center frequencies, and identify a list of candidate channels by their respective center frequencies wherein each item in the list of candidate channels is processed by a respective receiver unit;
   a controller module configured to instruct the spectrum identifier module and the spectrum analysis module to process the identified list of the candidate channels and to store service information relating to the identified list of the candidate channels in a memory; and
   a plurality of receiver modules configured, in response to instructions received from the controller module, to separately tune to each candidate channel center frequency and to output to the controller module any service information present at each candidate channel center frequency.

9. The receiver system of claim 8, wherein the controller module is configured to instruct the plurality of receiver modules to operate in parallel to determine service information relating to the candidate channels.

10. The receiver system of claim 9, further comprising:
    a full spectrum analog to digital converter configured to supply a digitized version of the input signal to the spectrum identifier module and to each receiver module of the plurality of receiver modules.

11. The receiver system of claim 8, wherein said receiver module comprises:
    a tuner;
    a demodulator; and
    a stream analyzer.

12. The receiver system of claim 11, wherein the demodulator and the stream analyzer are disposed in at least one respective client unit remote from a central control unit comprising:
    the tuner;
    the controller module;
    the memory;
    the spectrum identifier module; and
    the spectrum analysis module.

13. The receiver system of claim 12, wherein the controller module is configured to provide instructions to the at least one respective client unit to demodulate and analyze candidate channel signals from respective tuners and to return service information relating to the candidate channels.

14. The receiver system of claim 8 wherein all modules of the system are comprised in a single unit.

15. A computer program product embodied on a non-transitory, computer-readable medium comprising instructions for causing a computer to perform the method of claim 1.

* * * * *